(12) United States Patent
Cho et al.

(10) Patent No.: US 8,273,648 B2
(45) Date of Patent: Sep. 25, 2012

(54) CIRCUIT STRUCTURES AND METHODS WITH BEOL LAYERS CONFIGURED TO BLOCK ELECTROMAGNETIC EDGE INTERFERENCE

(75) Inventors: Choongyeun Cho, Hopewell Junction, NY (US); Daeik Kim, Beacon, NY (US); Jonghae Kim, Fishkill, NY (US); Moon Ju Kim, Wappingers Falls, NY (US); James R. Moulic, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/369,592

(22) Filed: Feb. 9, 2012

(65) Prior Publication Data

US 2012/0135599 A1  May 31, 2012

Related U.S. Application Data

(62) Division of application No. 12/188,243, filed on Aug. 8, 2008, now Pat. No. 8,138,563.

(51) Int. Cl.
H01L 21/3205 (2006.01)
(52) U.S. Cl. ......... 438/596; 438/595; 257/297; 257/422
(58) Field of Classification Search .................. 438/595, 438/596; 257/297, 422
See application file for complete search history.

(56) References Cited

U.S. PATENT DOCUMENTS

| | | |
|---|---|---|
| 5,659,245 A | 8/1997 | Ping et al. |
| 6,063,234 A | 5/2000 | Chen et al. |
| 6,166,403 A | 12/2000 | Castagnetti et al. |
| 6,187,660 B1 | 2/2001 | Gardner |
| 6,190,936 B1 | 2/2001 | Moore et al. |
| 6,300,241 B1 | 10/2001 | Moore et al. |
| 6,309,956 B1 | 10/2001 | Chiang et al. |

(Continued)

FOREIGN PATENT DOCUMENTS

WO  WO2006/011456 A1  2/2006

OTHER PUBLICATIONS

Kim et al., Office Action for U.S. Appl. No. 11/747,342, filed May 11, 2007 (U.S. Letters Patent No. 7,821,110 B2), dated Jun. 30, 2009.

(Continued)

*Primary Examiner* — Thao Le
*Assistant Examiner* — Geoffrey Ida
(74) *Attorney, Agent, or Firm* — William E. Schlesser, Esq.; Kevin P. Radigan, Esq.; Heslin, Rothenberg, Farley & Mesiti P.C.

(57) ABSTRACT

Back-end-of-line (BEOL) circuit structures and methods are provided for blocking externally-originating or internally-originating electromagnetic edge interference. One such BEOL circuit structure includes a semiconductor substrate supporting one or more integrated circuits, and multiple BEOL layers disposed over the semiconductor substrate. The multiple BEOL layers extend to an edge of the circuit structure and include at least one vertically-extending conductive pattern disposed adjacent to the edge of the circuit structure. The vertically-extending conductive pattern is defined, at least partially, by a plurality of elements disposed in the multiple BEOL layers. The plurality of elements are uniformly arrayed at the edge of the circuit structure in a first direction or a second direction throughout at least a portion thereof. The plurality of elements are sized and positioned in the first direction or the second direction to block electromagnetic interference of a particular wavelength from passing therethrough.

10 Claims, 5 Drawing Sheets

U.S. PATENT DOCUMENTS

| | | | |
|---|---|---|---|
| 6,319,818 B1 | 11/2001 | Stamper | |
| 6,455,770 B2 | 9/2002 | Pulver | |
| 6,677,248 B2 | 1/2004 | Kwon et al. | |
| 6,720,245 B2 | 4/2004 | Stucchi et al. | |
| 6,725,092 B2 | 4/2004 | MacDonald et al. | |
| 6,856,007 B2 | 2/2005 | Warner | |
| 6,865,084 B2 | 3/2005 | Lin et al. | |
| 6,888,063 B1 | 5/2005 | Lien et al. | |
| 6,972,209 B2 | 12/2005 | Agarwala et al. | |
| 6,975,189 B1 | 12/2005 | Reamon et al. | |
| 7,013,558 B2 | 3/2006 | Bachman | |
| 7,047,074 B2 | 5/2006 | Connelly et al. | |
| 7,067,902 B2 | 6/2006 | Hichri et al. | |
| 7,091,412 B2 | 8/2006 | Wang et al. | |
| 7,135,643 B2 | 11/2006 | vanHaaster et al. | |
| 7,141,883 B2 | 11/2006 | Wei et al. | |
| 7,145,084 B1 | 12/2006 | Sarihan et al. | |
| 7,250,363 B2 | 7/2007 | Landis et al. | |
| 7,821,110 B2 | 10/2010 | Kim et al. | |
| 2002/0096736 A1 | 7/2002 | Brennan et al. | |
| 2004/0074655 A1 | 4/2004 | Takahashi et al. | |
| 2004/0230271 A1 | 11/2004 | Wang et al. | |
| 2005/0034885 A1 | 2/2005 | Groves et al. | |
| 2006/0159958 A1 | 7/2006 | Lee | |
| 2006/0241236 A1 | 10/2006 | Kuznetsov et al. | |
| 2007/0013072 A1 | 1/2007 | Ellis-Monaghan et al. | |
| 2007/0257337 A1 | 11/2007 | Yanase et al. | |
| 2008/0084681 A1 | 4/2008 | Naito et al. | |
| 2010/0032814 A1 | 2/2010 | Cho et al. | |

OTHER PUBLICATIONS

Kim et al., Office Action for U.S. Appl. No. 11/747,342, filed May 11, 2007 (U.S. Letters Patent No. 7,821,110 B2), dated Dec. 31, 2009.

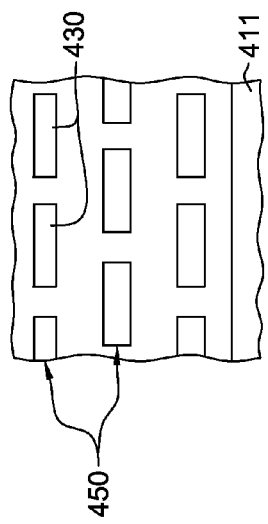
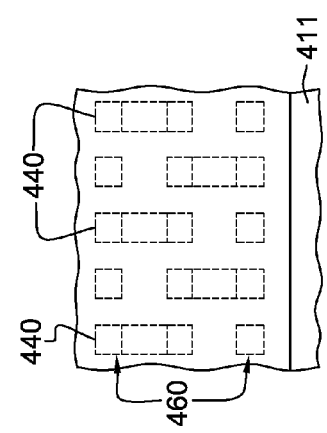
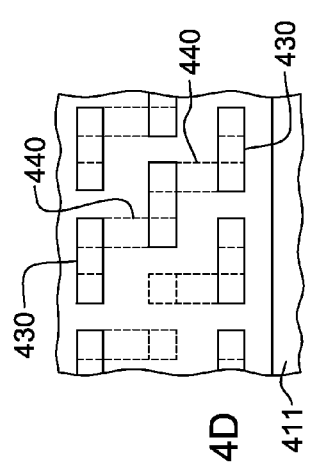
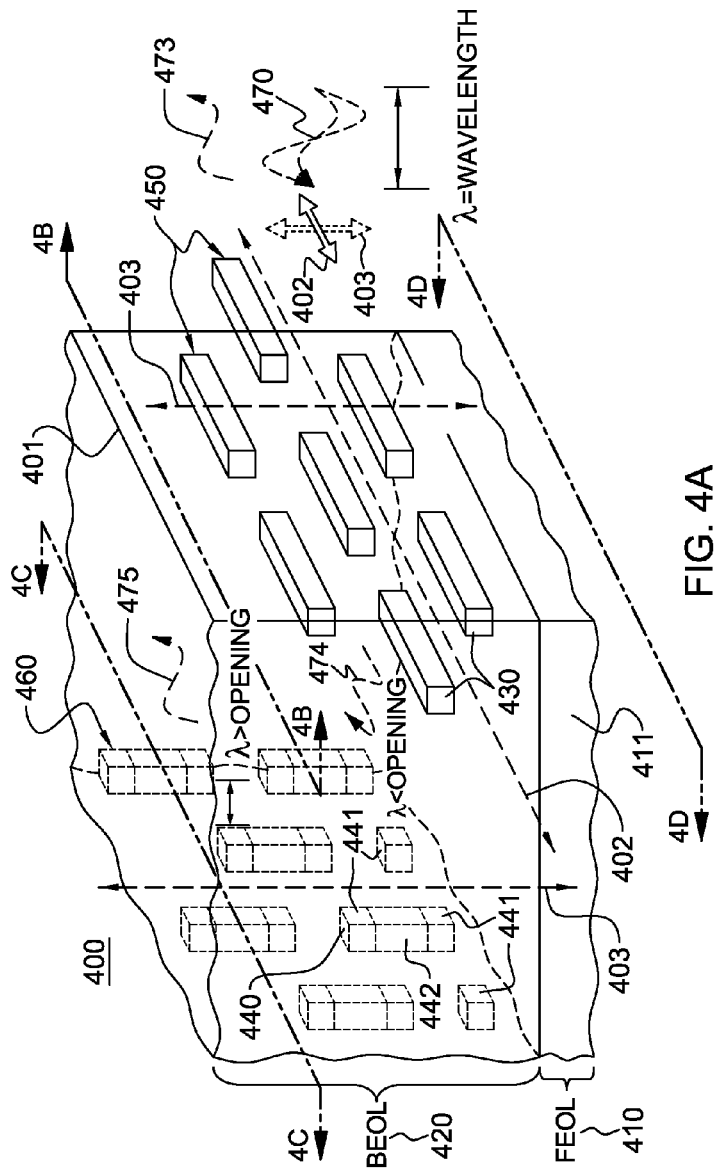

CIRCUIT STRUCTURES AND METHODS WITH BEOL LAYERS CONFIGURED TO BLOCK ELECTROMAGNETIC EDGE INTERFERENCE

CROSS-REFERENCE TO RELATED APPLICATION

This application is a divisional of co-pending U.S. Ser. No. 12/188,243, filed Aug. 8, 2008, entitled "Circuit Structures and Methods with BEOL Layers Configured to Block Electromagnetic Edge Interference", by Cho et al., which published Feb. 11, 2010, as U.S. Patent Publication No. 2010/00328141 A1, the entirety of which is hereby incorporated herein by reference.

TECHNICAL FIELD

The present invention relates in general to integrated circuits and methods of fabrication, and more particularly, to back-end-of-line (BEOL) structures and methods for shielding integrated circuits from externally (or internally) generated electromagnetic interference at an edge of the integrated circuit.

BACKGROUND OF THE INVENTION

As used herein, electromagnetic interference (EMI) refers generally to both electromagnetic interference emissions and radio frequency interference (RFI) emissions. The term "electromagnetic" should be considered to refer generally to electromagnetic and radio frequency.

During normal operation, electronic devices may generate undesirable electromagnetic energy that can interfere with the operation of adjacent electronic devices due to EMI transmission by radiation and conduction. Electromagnetic energy can be of a wide range of wavelengths and frequencies. To minimize problems associated with EMI, sources of undesirable electromagnetic energy may be shielded and electrically grounded using a housing or other enclosure. Alternatively, or additionally, susceptors of EMI may be similarly shielded and electrically grounded employing a housing. Shielding is designed to prevent both ingress and egress of electromagnetic energy relative to the housing or other enclosure in which the electronic device is disposed.

Shields are generally constructed to reduce EMI to a particular wavelength, or range of wavelengths. EMI shields are typically constructed of a conductive material operating to reflect the radiation component of EMI and to drain to electrical ground the conducted component of EMI. For example, EMI shields are typically constructed of a metal, such as copper, aluminum, gold, tin, steel and nickel. Conventionally, EMI shielding occurs at a package level wherein a conductive enclosure is placed externally around an electronic device, such as an electronic module. Shielding at this level may be both expensive and time consuming.

EMI protection is particularly important in small, densely packaged, sensitive electronic applications operating at high frequencies. EMI shielding for such applications is typically a separate housing structure, and a separate fabrication process from the fabrication process of the electronic device to be protected.

SUMMARY OF THE INVENTION

Accordingly, provided herein, in one aspect, is a circuit structure configured with integrated electromagnetic interference shielding at an edge thereof using conventional integrated circuit fabrication processes. In one embodiment, the circuit structure includes at least one substrate, comprising at least one integrated circuit, and multiple back-end-of-line (BEOL) layers disposed over the at least one substrate. The multiple BEOL layers define an edge of the circuit structure and comprise at least one vertically-extending conductive pattern disposed adjacent to the edge of the circuit structure. The at least one vertically-extending conductive pattern is defined at least partially by a plurality of elements disposed in different BEOL layers of the multiple BEOL layers. The plurality of elements are uniformly arrayed at the edge of the circuit structure in at least one of a first direction or a second direction throughout at least a portion thereof, and are sized and positioned at the edge of the circuit structure in at least one of the first direction or the second direction to block electromagnetic interference of a particular wavelength from passing therethrough.

In another embodiment, a circuit structure is provided which includes at least one semiconductor substrate, having at least on integrated circuit, and multiple back-end-of-line (BEOL) layers disposed over the at least one semiconductor substrate. The multiple BEOL layers extend to an edge of the circuit structure and comprise at least one vertically-extending conductive pattern disposed adjacent to the edge of the circuit structure. The multiple BEOL layers also include a plurality of BEOL dielectric layers interleaved with a plurality of BEOL interconnect metalization layers for electrically connecting, in part, to the at least one integrated circuit. The at least one vertically-extending conductive pattern is defined, at least partially, by a plurality of elements disposed in multiple different layers of at least one of the plurality of BEOL dielectric layers or the plurality of BEOL interconnect metalization layers. The plurality of elements are uniformly arrayed at the edge of the circuit structure in at least one of a first direction or a second direction throughout a portion thereof and are sized and positioned at the edge of the circuit structure in at least one of the first direction or the second direction to block electromagnetic interference of a particular wavelength or a range of wavelengths from passing therethrough.

In a further aspect, a method of fabricating a circuit structure is provided which includes: providing at least one semiconductor substrate comprising at least one integrated circuit; and forming multiple back-end-of-line (BEOL) layers over the at least one semiconductor substrate, wherein the multiple BEOL layers comprise a plurality of BEOL dielectric layers and a plurality of BEOL interconnect metalization layers, and wherein forming the multiple BEOL layers further includes: designing at least one vertically-extending conductive pattern disposed adjacent to the edge of the circuit structure and extending through the multiple BEOL layers; and providing the at least one vertically-extending conductive pattern by defining a pluarity of elements disposed in the multiple BEOL layers and uniformly arrayed in at least one of in a first direction or a second direction throughout at least a portion thereof at an edge of the circuit structure, wherein the plurality of elements of the at least one vertically-extending conductive pattern are sized and positioned at the edge of the circuit structure in at least one of the first direction or the second direction to block electromagnetic interference of a particular wavelength from passing therethrough.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 4A is a partial isometric view of an alternate embodiment of a circuit structure employing multiple vertically-extending conductive patterns or walls, each arrayed across multiple different BEOL layers adjacent to an edge of the circuit structure to block electromagnetic interference of a particular wavelength from passing therethrough, in accordance with an aspect of the present invention;

FIG. 4B is a cross-sectional elevational view of the circuit structure of FIG. 4A, taken along line 4B-4B thereof, in accordance with an aspect of the present invention;

FIG. 4C is a cross-sectional elevational view of the circuit structure of FIG. 4A, taken along line 4C-4C thereof, in accordance with an aspect of the present invention;

FIG. 4D is a side elevational view of the edge of the circuit structure of FIG. 4A, taken along line 4D-4D thereof, illustrating electromagnetic interference blocking overlap of the different vertically-extending conductive patterns or walls thereof, in accordance with an aspect of the present invention.

DETAILED DESCRIPTION OF THE INVENTION

As noted, presented herein are circuit structures and methods for blocking electromagnetic interference, for example, from ingressing into or egressing from an integrated circuit at an edge of a circuit structure employing back-end-of-line structures. As used herein, "blocking" refers to shielding, stopping, suppressing, or otherwise preventing an electromagnetic interference (EMI) wave from propagating therethrough. Both external electromagnetic interference and internal electromagnetic interference are addressed by the concepts disclosed herein. As one example, the circuit structure comprises an integrated circuit formed, for example, on or within a semiconductor substrate during front-end-of-line (FEOL) processing and having a plurality of interleaved interconnect metallization and dielectric layers formed during back-end-of-line (BEOL) processing above the integrated circuit.

Circuit structures for blocking electromagnetic interference, for example, from ingressing to or egressing from an integrated circuit at an upper planar surface thereof are described in co-pending, commonly assigned U.S. patent application Ser. No. 11/747,342, filed May 11, 2007, entitled "Circuit Structures and Methods with BEOL Layer(s) Configured to Block Electromagnetic Interference", the entirety of which is hereby incorporated herein by reference. The present application extends the concepts disclosed in this incorporated application to an edge of the circuit structure. As used herein, "edge" refers to a sidewall of the circuit structure before any encapsulation thereof, and more particularly, to an edge or sidewall of the multiple BEOL layers disposed above the substrate. Although described herein below with reference to externally generated electromagnetic interference impinging on the circuit structure, the concepts disclosed are also applicable to suppressing internally generated electromagnetic interference propagating, in part, in a horizontal manner from the integrated circuits of the circuit structure to an edge thereof.

Figure 1:
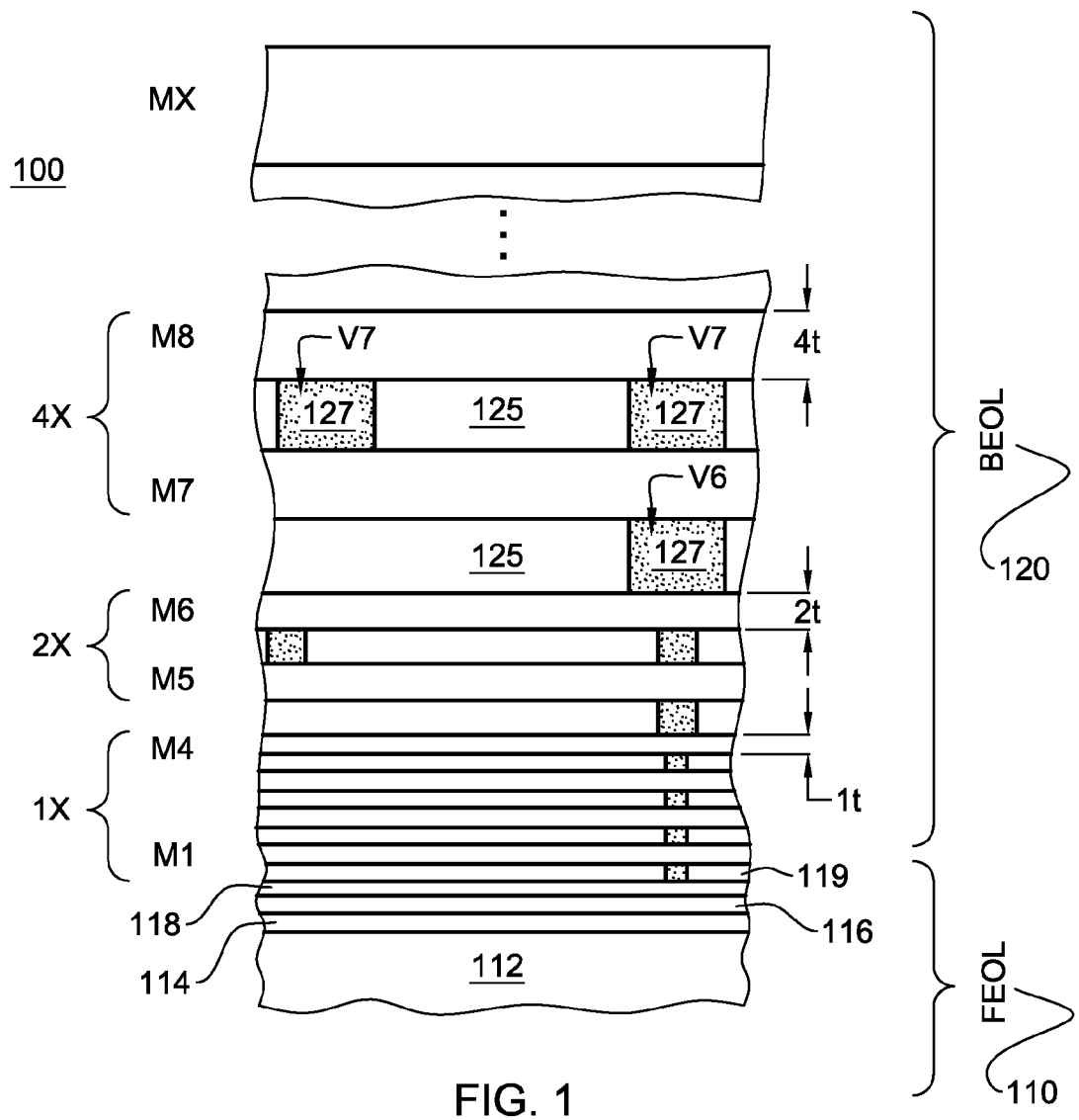
FIG. 1 is a partial cross-sectional elevational view of one embodiment of a circuit structure to employ electromagnetic interference (EMI) shielding at an edge thereof, in accordance with an aspect of the present invention.

FIG. 1 depicts one partial example of a circuit structure to employ electromagnetic interference shielding, in accordance with an aspect of the present invention. This circuit structure, generally denoted 100, includes FEOL layers/structures 110 and BEOL layers/structures 120. By way of example, FIG. 1 depicts a cross-sectional elevational view of one embodiment of a portion of a silicon wafer having multiple integrated circuit chips defined therein. In the depicted example, FEOL layers/structures 110 include a semiconductor substrate 112, a buried oxide layer 114, a silicon layer 116, and a polysilicon layer 118. As understood in the art, integrated circuits may reside within semiconductor substrate 112, as well as (or alternatively) within silicon layer 116 and polysilicon layer 118. A dielectric layer 119 functions as a contact layer to the integrated circuit layers and completes the FEOL layers/structures 110. BEOL layers 120 may also include one or more passive circuit structures vertically integrated with the integrated circuits. In one embodiment, these vertically integrated passive circuit structures in BEOL layers 120 may be disposed above the integrated circuits formed, for example, within semiconductor substrate 112, silicon layer 116 and/or polysilicon layer 118.

Disposed above FEOL layers/structures 110 are the plurality of BEOL layers/structures 120, which conventionally include a plurality of interleaved BEOL dielectric layers and BEOL interconnect metallization layers. In this example, the BEOL interconnect metallization layers are labeled M1 . . . MX, with the layer between adjacent interconnect metallization layers being a BEOL dielectric layer.

As shown in FIG. 1, the upper BEOL interconnect metallization layers become progressively thicker, with (for example) interconnect metallization layers M5, M6 being 2× the thickness of interconnect metallization layers M1 . . . M4, interconnect metallization layers M7, M8 being 4× the thickness of interconnect metallization layers M1 . . . M4, and an upper most interconnect metallization layer MX being 8× the thickness of metallization layers M1 . . . M4. As noted, disposed between the BEOL interconnect metallization layers are the plurality of BEOL dielectric layers 125. BEOL dielectric layers 125 also become progressively thicker to mirror the thicknesses of the respective interconnect metallization layers. As shown, metalized vias 127 extend between adjacent interconnect metallization layers to, for example, facilitate electrical connection to the underlying integrated circuit(s). By way of example, metalized vias V7 electrically interconnect metal layers M7 & M8, and metalized vias V6 electrically interconnect metal layers M6 & M7, etc.

As explained further below, presented herein are various design modifications to the plurality of BEOL layers which provide for electromagnetic interference shielding at the edge or sidewall of a circuit structure within the constraints of conventionally accepted fabrication techniques.

Electromagnetic interference shielding at the edge or sidewall of the circuit structure is becoming more important as circuit structures become more vertically integrated. Vertical integration is achieved, in one aspect, by increasing the number of BEOL layers above the substrate. With this increase in BEOL layers, the circuit structure becomes vulnerable to horizontal electromagnetic interference. An external electromagnetic interference wave can travel through non-conducting materials, such as dielectric material, when the spacing between the conductive materials is greater than the wavelength of the electromagnetic wave. Conventionally, a BEOL layer such as a BEOL dielectric layer includes, in addition to a plurality of metalized interconnect vias, a plurality of metal fill blocks that are arbitrarily added to the BEOL layer to satisfy a chemical-mechanical polishing (CMP) ratio. The chemical-mechanical polishing ratio is an area-occupation ratio between the dielectric material, such as silicon dioxide, in the metal vias and metal fill blocks. By way of example, BEOL CMP patterning is discussed in U.S. Pat. Nos. 7,067, 902; 6,972,209; 6,319,818; and 6,309,956. To improve mechanical yield of the dielectric layer, independent upon the number of metalized vias, metal fill blocks may be added to facilitate chemical-mechanical polishing and manufacturability. Similarly, an interconnect metalization layer (such as M1 ... MX) in FIG. 1 may be provided with a plurality of dielectric fill openings through the metal layer, to, again, facilitate CMP and manufacturability. Current semiconductor BEOL algorithms for arbitrarily placing metal fill blocks and/or dielectric filled holes in a BEOL layer allow both externally and internally generated electromagnetic interference to reach noise-sensitive circuits from an edge or sidewall of the circuit structure. This is in part because the typical fill/hole algorithms used in BEOL processing are directed to facilitating chemical-mechanical polishing only, and do not consider the electromagnetic interference phenomenon, and particularly, not the electromagnetic interference phenomenon viewed from an edge of the circuit structure.

Current semiconductor BEOL algorithms for arbitrarily placing metal fill blocks and/or dielectric fill holes in BEOL layers typically result in a circuit structure edge which allows electromagnetic interference with a horizontal propagation component to pass therethrough. Electromagnetic interference can pass through a plurality of BEOL layers from an edge of the circuit structure when the BEOL layers have an opening therein, viewed from the edge of the circuit structure, which is greater than the wavelength of the electromagnetic interference wave.

Figure 2:
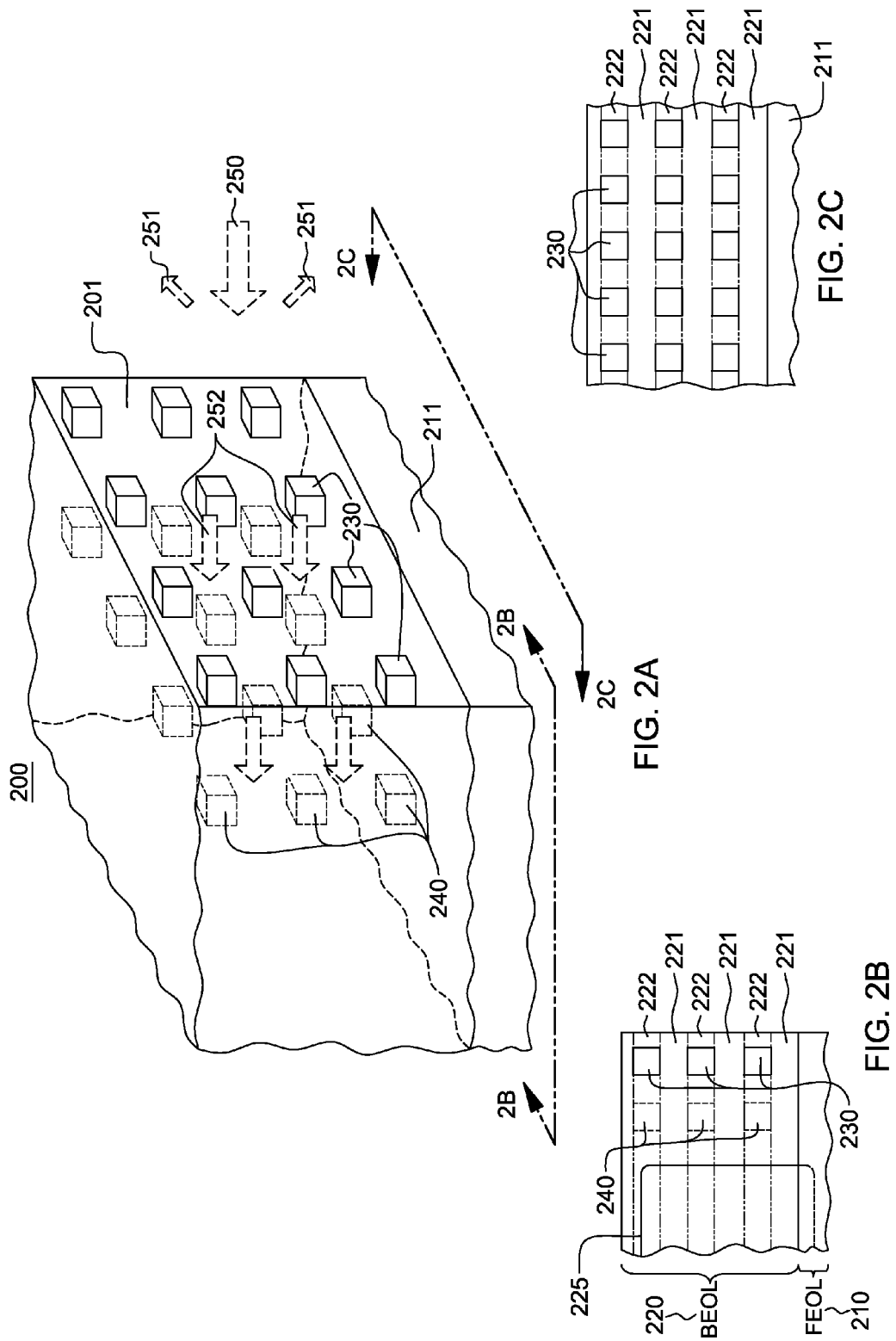
FIG. 2A is a partial isometric view of one embodiment of a circuit structure with multiple vertically-extending conductive patterns disposed at an edge thereof, to (for example) at least partially block external EMI impinging on the multiple back-end-of-line (BEOL) layers at the edge thereof, in accordance with an aspect of the present invention.
FIG. 2B is a front, cross-sectional elevational view of the circuit structure of FIG. 2A, taken along line 2B-2B thereof, in accordance with an aspect of the present invention.
FIG. 2C is a side elevational view of the edge of the circuit structure of FIG. 2A, in accordance with an aspect of the present invention.

FIGS. 2A-2C depict on embodiment of a circuit structure 200 comprising multiple vertically-extending conducting patterns or walls disposed adjacent to an edge 201 thereof, in accordance with an aspect of the present invention. As shown, circuit structure 200 includes a substrate 211 supporting FEOL layers/structures 210 and BEOL layers/structures 220. By way of example, BEOL layers 220 include multiple alternating dielectric layers 221 and interconnect metalization layers 222. Within FEOL layers 210 and BEOL layers 220 one or more integrated circuits 225 are defined. For example, BEOL layers 220 may include one or more passive circuit structures vertically integrated with integrated circuits disposed within substrate 211.

In this example, a relatively simple semiconductor BEOL algorithm is employed in placing, for example, conductive fill elements 230 within interconnect metalization layers 222 adjacent to edge 201 of circuit structure 200 to form a first vertically-extending conductive pattern or wall. Further, conductive fill elements 240 are also uniformly arrayed in the interconnect metalization layers 222 to define a second vertically-extending conductive pattern or wall spaced in parallel opposing relation to the first vertically-extending pattern or wall.

As illustrated in the isometric view of FIG. 2A, external electromagnetic interference (EMI) 250 impinging on edge 201 of circuit structure 200 has a first portion 251 deflected by the conductive elements 230, 240, and a second portion 252 which propagates into the circuit structure from edge 201, potentially impacting integrated circuit 225 (see FIG. 2B). The ability of second portion 252 to pass into circuit structure 200 depends upon the vertical and horizontal spacing between conductive fill elements 230, 240 in each vertically-extending conductive pattern, as well as the configuration and disposition of the conductive fill elements 230 in the first vertically-extending conductive pattern compared with the configuration and disposition of conductive fill elements 240 in the second vertically-conductive pattern of the plurality of BEOL layers of the circuit structure. This EMI propagation phenomenon is illustrated in greater detail in FIG. 3.

Figure 3:
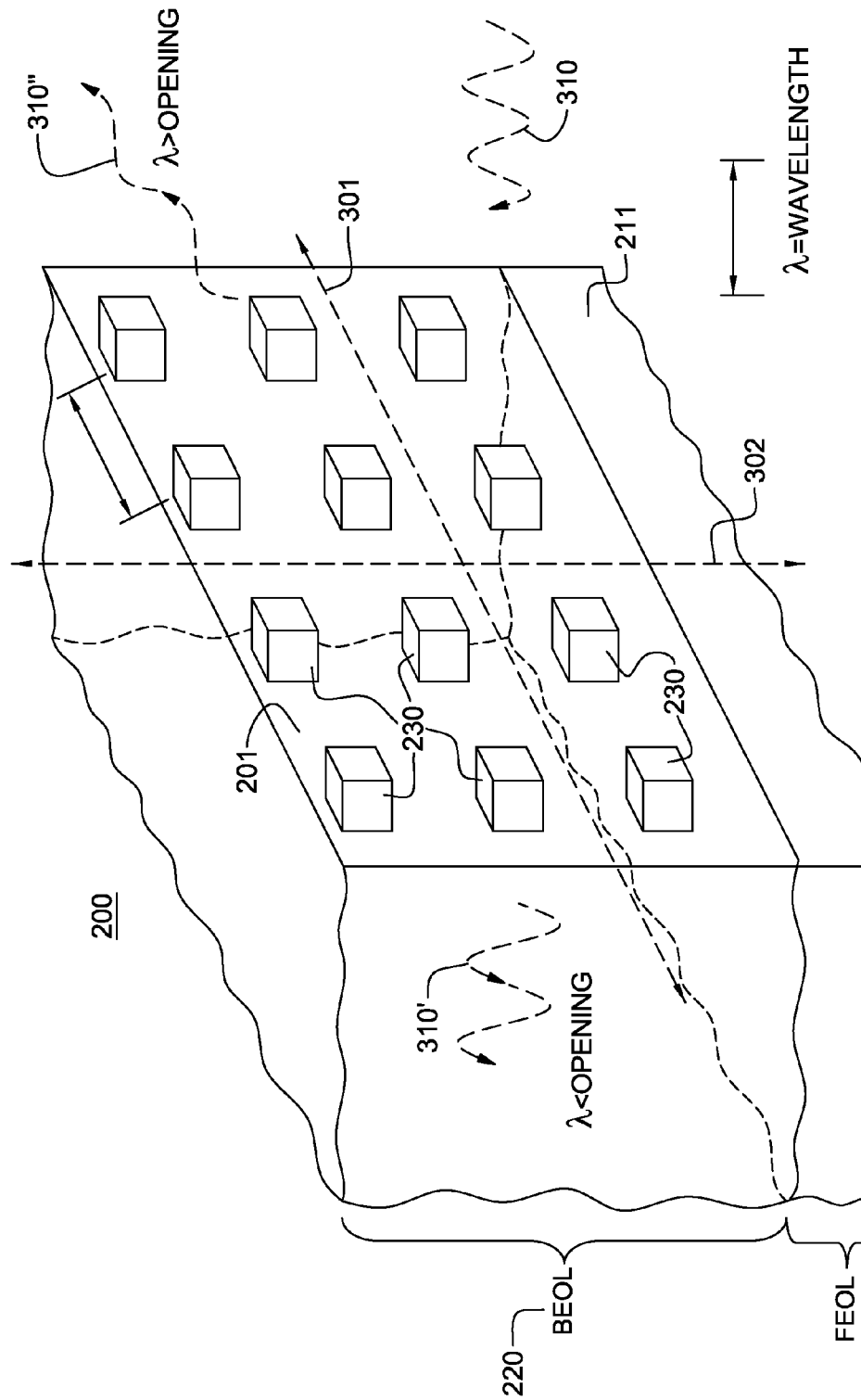
FIG. 3 is a partial isometric view of one embodiment of a circuit structure with a vertically-extending conductive pattern at an edge thereof arrayed across multiple BEOL layers, which is useful in explaining aspects of the present invention.

In FIG. 3, only the conductive fill elements 230 are illustrated. These conductive fill elements define a vertically-extending conductive wall disposed adjacent to edge 201 of circuit structure 200. As shown, circuit structure 200 also includes a substrate 211 supporting FEOL layers/structures 210 and BEOL layers/structures 220. In view of the configuration of conductive fill elements 230 and the uniform spacing between the conductive fill elements in the horizontal direction 301 and the vertical direction 302, significant spacing is shown to exist between the conductive fill elements 230 in both the horizontal and vertical directions. Depending upon the angle of incidence, and the wavelength of the edge impacting EMI 310, the EMI may pass into the circuit structure through the first vertically-extending conductive pattern as electromagnetic interference 310'. This EMI 310' has a wavelength smaller than the size of the openings in the edge 201 of circuit structure 200 between conductive fill elements 230. Alternatively, EMI 310" is reflected from the edge 201 of circuit structure 200 if its wavelength is greater than the size of the openings between conductive fill elements 230 at the edge of the circuit structure.

An EMI wave thus freely propagates within the circuit structure if there is a non-conductive opening at the edge of the circuit structure greater than its wavelength. As circuit structures become more vertically integrated, with an ever greater number of BEOL layers, electromagnetic interference impinging on the edges of the circuit structures becomes an increasingly significant issue. Thus, presented herein, in one aspect, is an approach for designing vertically-extending conductive patterns within the BEOL layers adjacent to one or more edges of the circuit structure to block electromagnetic interference of a particular wavelength from passing therethrough. The multiple different BEOL layers are configured at the edge of the circuit structure to achieve a fill and via patterning at the circuit structure edge that results in a conductive fill pattern with a shape, size, spacing and orientation to achieve electromagnetic filtering and reflection at the edge of the circuit structure. One or more vertically-extending conductive patterns or walls adjacent to an edge may be defined within the multiple BEOL layers.

FIGS. 4A-4D depict one partial embodiment of a circuit structure 400, in accordance with an aspect of the present invention. Circuit structure 400 includes one or more substrates 411 having FEOL layers/structures 410 and BEOL layers/structures 420 disposed therein and thereon. Although not illustrated, one or more integrated circuits are fabricated within FEOL layers/structures 410 and/or BEOL layers/structures 420. Circuit structure 400 also includes an edge or sidewall 401 onto which an external EMI wave 470 having a wavelength λ is shown to impinge. A first vertically-extending conductive pattern or wall 450 is formed of a plurality of conductive fill structures 430, each of which is shown to comprise (in one embodiment) a rectangular-shaped fill structure extending horizontally, parallel to a plane of edge 401. Within a single BEOL layer (e.g., a BEOL interconnect metalization layer), multiple such rectangular-shaped conductive fill elements 430 are disposed, for example, along a common axis extending horizontally and parallel to edge 401 of circuit structure 400. This pattern along edge 401 is repeated in multiple BEOL layers resulting in the illustrated vertically-extending conductive pattern or wall 450, which is a first conductive fill pattern or wall disposed adjacent to edge 401 of circuit structure 400. In spaces between rectangular-shaped conductive elements 430 where the dielectric material opening is larger than wavelength λ (along a first direction 402 or a second direction 403), electromagnetic interference 474 may pass through the vertically-extending conductive pattern 450, while in those spaces where the wavelength λ is larger than the dielectric material opening, electromagnetic interference 473 is reflected. Advantageously, this property is employed herein to modify the multiple BEOL layers/structures 420 to enhance EMI reflectivity in one or both arrayed directions of, for example, the conductive fill structures of multiple different BEOL layers. In one embodiment, multiple vertically-extending conductive patterns or walls 450, 460 are employed for enhanced filtering of electromagnetic interference, for example, using polarization.

FIG. 4A depicts one example of this polarization concept wherein a second vertically-extending conductive pattern or wall 460 is provided adjacent and in spaced opposing relation to first vertically-extending conductive pattern or wall 450. The plurality of conductive elements 440 of second vertically-extending conductive pattern 460 are arrayed in second direction 403, perpendicular to the rectangular-shaped conductive elements 430 arrayed in first direction 402. At least some conductive elements 440 of second vertically-extending conductive pattern 460 comprise conductive fill structures 441 interconnected by a metalized via or conduit 442 through an intervening layer of circuit structure 400. In the example of FIGS. 4A-4D, the shape, size, spacing and orientation of the plurality of elements 430 in first vertically-extending conductive pattern 450 are designed to polarize in first direction 402 external electromagnetic interference 470 impinging an edge 401. That is, in the second direction 403, the electromagnetic wavelength will typically be greater than the opening space between adjacent rectangular-shaped conductive elements 430, thereby resulting in a blocking (i.e., reflecting) of the electromagnetic interference 473. As shown, when electromagnetic interference 474 wavelength λ is less than the opening space in first direction 402, the interference passes through first vertically-extending conductive pattern 450, thereby resulting in polarization of initially impinging electromagnetic interference.

The polarized electromagnetic interference 474 passing through first vertically-extending conductive pattern 450 subsequently impinges upon second vertically-extending conductive pattern 460, where the plurality of vertically oriented conductive elements 440 are encountered. As noted, these elements have an orientation substantially orthogonal to the orientation of rectangular-shaped conductive elements 430 of first vertically-extending conductive pattern 450. More particularly, in the depicted example, the elements of second vertically-extending conductive pattern 460 are arrayed in first direction 402 and second direction 403 (by way of example only), and are sized and positioned to block electromagnetic interference propagating in the first direction 402. This is achieved by limiting the space between the conductive fill elements 440 in the first direction (as illustrated). Thus, the impinging polarized electromagnetic interference 474 propagating in the first direction is blocked (e.g., reflected) 475 by the conductive fill elements 440 of second vertically-extending conductive pattern 460. This cooperative blocking effect of the first vertically-extending conductive pattern and second vertically-extending conductive pattern is illustrated in the edge view of FIG. 4D, wherein the conductive fill elements 430 and the conductive fill elements 440 of the first and second vertically-extending conductive patterns, respectively, are shown overlaid, to depict the blocking structures encountered by an externally impinging EMI wave at the edge of the circuit structure's BEOL layers.

Figure 5:
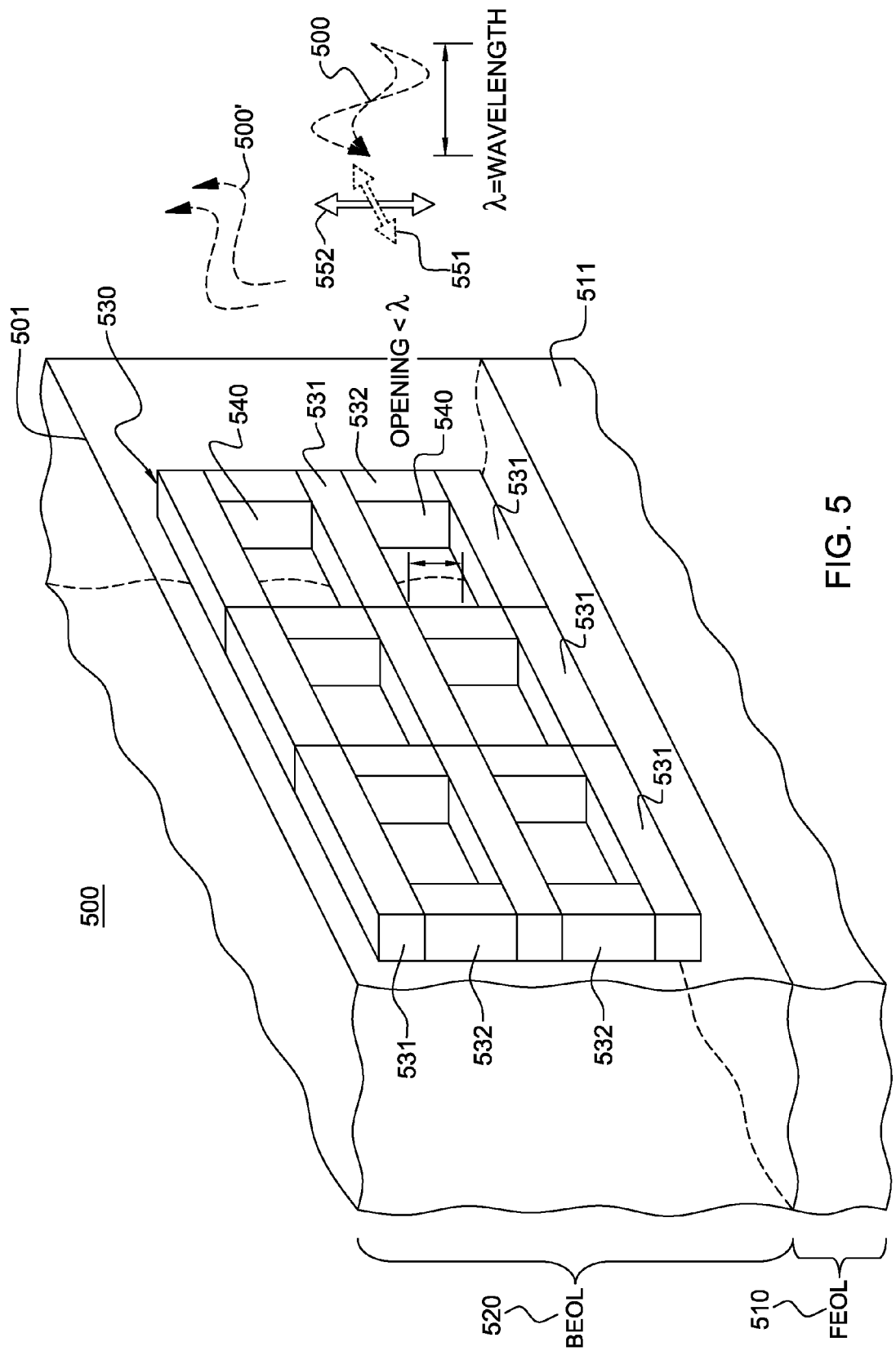
FIG. 5 is a partial isometric view of an alternate embodiment of a circuit structure with a vertically-extending conductive pattern or wall arrayed across multiple BEOL layers at an edge thereof to block electromagnetic interference of a particular wavelength from passing therethrough, in accordance with an aspect of the present invention.

FIG. 5 depicts an alternate embodiment of a vertically-extending conductive pattern, generally denoted 530, disposed adjacent to an edge 501 of a circuit structure 500. As shown, circuit structure 500 also comprises a substrate 511, FEOL layers/structures 510 and BEOL layers/structures 520, such as described above in connection with FIGS. 1-4D. In this embodiment, vertically-extending conductive pattern 530 is configured as a screen or mesh conductive structure disposed adjacent to edge 501. This mesh structure includes multiple horizontally-extending conductive elements 531 disposed in different BEOL layers of BEOL layers/structures 520, and a plurality of vertically-extending conductive elements 532 interconnecting the horizontally-extending conductive elements 531 into the vertically-extending conductive pattern 530 illustrated. The electrically interconnected horizontally-extending conductive elements 531 and vertically-extending conductive elements 532 define dielectric openings or spaces 540 within the vertically-extending conductive pattern 530. These dielectric spaces or openings 540 are designed or selected to be smaller than the wavelength λ of the electromagnetic interference wave 500 to be blocked. More particularly, the size of dielectric spaces 540 in both a first direction 551 and a second direction 552 are smaller than the wavelength λ of the impinging electromagnetic interference 500 to be blocked, thus resulting in reflection of the electromagnetic interference 500' at edge 501 of circuit structure 500. As one example, the vertically-extending conductive pattern 530 may be viewed as a grounded, conductive mesh structure at edge 501 of circuit structure 500.

Advantageously, those skilled in the art will note from the above discussion that presented herein is a novel approach to employing chemical-mechanical polishing fill patterns in different BEOL dielectric layers and/or BEOL metalization interconnect layers for achieving electromagnetic interference shielding at an edge or sidewall of a circuit structure. The electromagnetic interference shielding achieved is adjustable by controlling the cutoff EMI wavelength which is allowed to pass through a given vertically-extending conductive pattern, for example, by appropriately adjusting the shape, size, spacing or orientation characteristics of the conductive pattern(s) in multiple different BEOL layers, or more particularly, of the conductive elements in the pattern(s), or the openings in a conductive mesh structure. Multiple vertically-extending conductive patterns or walls may be employed with different fill/opening patterns and different filter orientations in order to achieve a desired level or range of electromagnetic interference shielding.

Advantageously, the concepts presented herein are implementable without any technology process change to traditional semiconductor integrated circuit fabrication. The conductive patterns employed may be selected to further BEOL chemical-mechanical polishing ratio compliance of the BEOL layers. Thus, electromagnetic interference shielding at the edge or sidewall of the circuit structure can be achieved within existing design rules, and integrated circuit chip manufacturability is enhanced.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of fabricating a circuit structure comprising:
providing a chip comprising at least one substrate, the at least one substrate comprising at least one integrated circuit and a main surface;
forming multiple back-end-of-line (BEOL) layers disposed over the main surface of the at least one substrate, the multiple BEOL layers extending to a common edge of the chip which defines a sidewall of the multiple BEOL layers, the sidewall being exposed at the common edge of the chip and forming the multiple BEOL layers comprises forming at least one vertically-extending conductive pattern in the sidewall at the common edge of the chip and oriented perpendicular to the main surface of the at least one substrate thereof; and
wherein the at least one vertically-extending conductive pattern in the sidewall is defined partially by dielectric material and partially by a plurality of conductive elements disposed within the dielectric material of the multiple BEOL layers, at least some conductive elements of the plurality of conductive elements being spaced apart along the sidewall in a vertical direction and a horizontal direction throughout at least a portion of the multiple BEOL layers, with at least two conductive elements of the plurality of conductive elements residing within one BEOL layer of the multiple BEOL layers at the sidewall thereof exposed at the common edge of the chip and being spaced apart by dielectric material of the one BEOL layer, and with at least two other conductive elements of the plurality of conductive elements residing within different BEOL layers of the multiple BEOL layers at the sidewall thereof exposed at the common edge of the chip and being spaced apart by dielectric material of at least a third BEOL layer of the multiple BEOL layers, and the plurality of conductive elements being sized and positioned at the sidewall in the vertical direction and the horizontal direction to block electromagnetic interference of a particular wavelength from passing therethrough from a direction intersecting the common edge of the chip.

2. The method of claim 1, wherein the forming multiple BEOL layers comprises forming multiple BEOL dielectric layers and multiple BEOL interconnect metalization layers, and the at least one vertically-extending conductive pattern comprises at least one vertically-extending conductive fill pattern arrayed in the sidewall of the multiple BEOL layers in different layers of at least one of the multiple BEOL dielectric layers or the multiple BEOL interconnect metalization layers.

3. The method of claim 1, wherein the forming multiple BEOL layers comprises forming multiple vertically-extending conductive patterns disposed adjacent to the common edge of the chip, each vertically-extending conductive pattern defining a respective vertically-extending conductive wall of multiple vertically-extending conductive walls defined by the multiple vertically-extending conductive patterns, the sidewall being one vertically-extending conductive wall of the multiple vertically-extending conductive walls, and wherein a first vertically-extending conductive wall is configured to polarize electromagnetic interference in one of the vertical direction or the horizontal direction, and a second vertically-extending conductive wall, spaced in parallel opposing relation to the first vertically-extending conductive wall, is configured to block polarized electromagnetic interference in the one of the vertical direction or the horizontal direction from passing therethrough, wherein the first vertically-extending conductive wall and the second vertically-extending conductive wall cooperate to block the electromagnetic interference of particular wavelength in any direction at the common edge of the chip.

4. The method of claim 3, wherein the forming multiple BEOL layers comprises forming multiple BEOL dielectric layers and multiple BEOL interconnect metalization layers, and the first vertically-extending conductive wall is defined, at least in part, by a first conductive fill pattern arrayed in the sidewall of the multiple BEOL layers in at least one of the multiple BEOL dielectric layers or the multiple BEOL interconnect metalization layers, and the second vertically-extending conductive wall is defined, at least in part, by a second conductive fill pattern disposed adjacent to the first conductive fill pattern in at least one of the multiple BEOL dielectric layers or the multiple BEOL interconnect metalization layers.

5. The method of claim 4, wherein the plurality of elements of the first conductive fill pattern are oriented differently from the plurality of elements of the second conductive fill pattern.

6. The method of claim 4, wherein the plurality of elements of the first conductive fill pattern or the plurality of elements of the second conductive fill pattern comprise horizontal elongate structures, and the other of the plurality of elements of the first conductive fill pattern and the plurality of elements of the second conductive fill pattern comprise vertically elongate structures, the vertically elongate structures each extending through at least two BEOL layers of the multiple BEOL layers and comprising, at least in part, a conductive via extending through at least one BEOL dielectric layer of the multiple BEOL dielectric layers.

7. The method of claim 3, wherein the plurality of elements of the first vertically-extending conductive pattern are sized and positioned to block the electromagnetic interference of particular wavelength in the horizontal direction, polarizing the electromagnetic interference in the vertical direction, and the plurality of elements of the second vertically-extending conductive pattern are sized and positioned to block the electromagnetic interference of particular wavelength in the vertical direction.

8. The method of claim 1, wherein the plurality of elements comprise a plurality of discrete, fill structures arrayed at the sidewall of the multiple BEOL layers.

9. The method of claim 8, wherein the plurality of discrete, fill structures at the sidewall of the multiple BEOL layers are sized and positioned in at least one of the vertical direction or the horizontal direction to block the electromagnetic interference of particular wavelength from passing therethrough, and further function as chemical-mechanical polishing fill structures which facilitate satisfying a chemical-mechanical polishing ratio for the multiple BEOL layers.

10. The method of claim 1, wherein the at least one vertically-extending conductive pattern of the multiple BEOL layers comprises a vertically-extending conductive mesh structure at the sidewall of the multiple BEOL layers, the vertically-extending conductive mesh structure comprising, in part, vertically-extending conductive vias electrically connecting horizontally-extending conductive elements disposed in different BEOL layers of the multiple BEOL layers, and wherein the vertically-extending conductive mesh structure comprises a plurality of dielectric openings arrayed therein, the plurality of dielectric openings being sized too small for the electromagnetic interference of particular wavelength to pass therethrough.

* * * * *